(12) United States Patent
Kim et al.

(10) Patent No.: US 7,754,398 B2
(45) Date of Patent: Jul. 13, 2010

(54) PHOTO MASK HAVING ASSIST PATTERN AND METHOD OF FABRICATING THE SAME

(75) Inventors: Hee-bom Kim, Suwon-si (KR); Jeung-woo Lee, Suwon-si (KR); Sung-min Huh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 448 days.

(21) Appl. No.: 11/821,762

(22) Filed: Jun. 25, 2007

(65) Prior Publication Data

US 2008/0090156 A1    Apr. 17, 2008

(30) Foreign Application Priority Data

Oct. 17, 2006    (KR)    ........................ 10-2006-0101024

(51) Int. Cl.
*G03F 1/00* (2006.01)

(52) U.S. Cl. ............................................. 430/5; 216/41

(58) Field of Classification Search ...................... 430/5, 430/311–313, 322; 216/41
See application file for complete search history.

(56) References Cited

U.S. PATENT DOCUMENTS

| | | | | |
|---|---|---|---|---|
| 5,087,535 | A * | 2/1992 | Hirokane et al. ................ | 430/5 |
| 5,437,947 | A * | 8/1995 | Hur et al. ........................ | 430/5 |
| 6,013,397 | A * | 1/2000 | Lin et al. ........................ | 430/5 |
| 7,014,962 | B2 * | 3/2006 | Lin et al. ........................ | 430/5 |
| 2001/0033977 | A1 * | 10/2001 | Itoh ............................... | 430/5 |
| 2002/0151157 | A1 * | 10/2002 | Kim et al. .................... | 438/552 |
| 2003/0235764 | A1 * | 12/2003 | Corliss et al. .................. | 430/5 |
| 2007/0082275 | A1 * | 4/2007 | Chang ............................ | 430/5 |
| 2008/0241708 | A1 * | 10/2008 | Lin et al. ........................ | 430/5 |

FOREIGN PATENT DOCUMENTS

| | | |
|---|---|---|
| JP | 10-186628 | 7/1998 |
| JP | 2004-109346 | 4/2004 |
| KR | 10-2006-0042769 | 5/2006 |

* cited by examiner

*Primary Examiner*—Mark F Huff
*Assistant Examiner*—Stewart A Fraser
(74) *Attorney, Agent, or Firm*—Mills & Onello, LLP

(57) ABSTRACT

A photomask has highly reliable assist patterns, and a method of fabricating the same is provided. The photomask includes a transparent substrate, circuit pattern and assist patterns. The circuit pattern recessed into the transparent substrate relative to a surface thereof has a first thickness, and assist patterns located adjacent to, and spaced apart from, the circuit pattern are recessed into the transparent substrate relative to the surface thereof while having a second thickness less than the first thickness.

26 Claims, 4 Drawing Sheets

PHOTO MASK HAVING ASSIST PATTERN AND METHOD OF FABRICATING THE SAME

CROSS-REFERENCE TO RELATED PATENT APPLICATION

This application claims priority under 35 U.S.C. 119 to Korean patent application No. 10-2006-0101024, filed on Oct. 17, 2006, in the Korean Intellectual Property Office, the disclosure of which is incorporated herein in its entirety by reference.

BACKGROUND OF THE INVENTION

1. Field of the Invention

Embodiments of the present invention relate to an apparatus for fabricating a semiconductor device and a method of fabricating the same, and more particularly to a photomask and a method of fabricating the same.

2. Description of the Related Art

In order to increase the integration of semiconductor devices, a technique of forming fine patterns having a significantly small critical dimension on a semiconductor substrate is required. To meet this demand, photolithography using a photomask having assist patterns proximal to circuit patterns has been used. Using such a photolithography approach, a depth of focus and a critical dimensional margin of the circuit patterns transferred onto a semiconductor substrate can be increased. The assist patterns are formed on the photomask, but are minimally transferred onto the semiconductor substrate, or are not transferred at all.

FIG. 1 is a sectional view illustrating a conventional photomask. Referring to FIG. 1, a photomask includes a circuit pattern 120 and assist patterns 130 on a transparent substrate 110. The assist patterns 130 of the photomask have too small of a critical dimension to be transferred onto a semiconductor substrate when performing photolithography. Due to the diffraction characteristic of light, the assist patterns 130 are not transferred onto the semiconductor substrate.

However, the forming of the assist patterns 130 having such a minute critical dimension causes several problems during fabrication. For example, resolution restrictions of an apparatus of recording electron beams result in inferior forming of the assist patterns 130. The inferior formation of the assist patterns 130 is a serious problem when analyzing a defect of the photomask. Also, because of the minute critical dimension, the assist patterns 130 can readily collapse when cleansing, etc.

SUMMARY OF THE INVENTION

Embodiments of the present specification provide a photomask having highly reliable assist patterns.

Embodiments of the present specification also provide a method of economically fabricating such a photomask.

According to an aspect, there is provided a photomask comprising: a transparent substrate; a circuit pattern recessed into the transparent substrate relative to a surface thereof, and having a first thickness; and assist patterns located adjacent to the circuit pattern, recessed into the transparent substrate relative to the surface thereof, and having a second thickness less than the first thickness.

Each of the circuit pattern and the assist patterns can comprise a light-blocking layer. Each of the circuit pattern and the assist patterns can further comprise an anti-reflection layer on the light-blocking layer. The anti-reflection layer can comprise an oxide film of the light-blocking layer.

Each of the circuit pattern and the assist patterns can comprise a phase-shifter.

The second thickness can be of a thickness that is about 20~85% of the first thickness.

According to another aspect, there is provided a photomask comprising: a transparent substrate; a circuit pattern formed on the transparent substrate, and having a first thickness; and assist patterns disposed adjacent to, and spaced apart from, the circuit pattern, recessed into the transparent substrate relative to a surface thereof, and having a second thickness less than the first thickness.

Each of the circuit pattern and the assist patterns can comprise a light-blocking layer. Each of the circuit pattern and the assist patterns can further comprise an anti-reflection layer on the light-blocking layer. Each of the circuit pattern and the assist patterns can comprise a phase-shifter.

The second thickness can be of a thickness that is about 20~85% of the first thickness.

According to another aspect, there is provided a method of fabricating a photomask comprising: forming a pair of first trenches in a transparent substrate, the pair of first trenches having a first depth from a surface of the transparent substrate; forming a second trench in a portion of the transparent substrate between the pair of first trenches, the second trench having a second depth that is greater than the first depth; and simultaneously forming a circuit pattern filled in the second trench and assist patterns filled in the first trenches, using a damascene method.

The forming of the first trenches can comprise: forming a first protection film pattern on the transparent substrate; and etching the transparent substrate to the first depth using the first protection film pattern as an etch barrier film.

The forming of the second trench can comprise: forming the pair of first trenches, and simultaneously etching a portion of the transparent substrate between the pair of first trenches as deep as the first depth; forming second protection film patterns covering the pair of first trenches; and further etching the transparent substrate already etched to the first depth down to the second depth, using the first protection film pattern and the second protection film patterns as an etch barrier film.

The forming of the first protection film pattern and the second protection film patterns can be performed using electron beam recording.

The forming of the circuit pattern and the assist patterns can comprise forming light-blocking layers filled in the first trenches and the second trench.

The method can further comprise forming anti-reflection layers by oxidizing surfaces of the light-blocking layers of the circuit pattern and the assist patterns.

The forming of the circuit pattern and the assist patterns can comprise forming a phase-shifter filled in the first trenches and the second trench.

The first depth can be of a depth about 20~85% of the second depth.

According to another aspect, there is provided a method of fabricating a photomask comprising: forming a pair of first trenches in a transparent substrate, the pair of first trenches being spaced apart from each other and having a first depth relative to a surface of the transparent substrate; forming a light-blocking layer on the transparent substrate including the first trenches, that fills the first trenches; and patterning the light-blocking layer to provide assist patterns in the first trenches and a circuit pattern in a region between the assist patterns, the circuit pattern having a thickness that is greater than the first depth of the assist patterns.

The forming of the first trenches comprises: forming a first protection film pattern on the transparent substrate; and etching the transparent substrate to the first depth using the first protection film pattern as an etch barrier film.

The method can further comprise forming anti-reflection layers by oxidizing surfaces of the light-blocking layers of the circuit pattern and the assist patterns.

The forming of the circuit pattern and the assist patterns can comprise forming a phase-shifter.

The first depth of the assist patterns can be about 20~85% of the thickness of the circuit pattern.

BRIEF DESCRIPTION OF THE DRAWINGS

The above and other features and advantages of the embodiments of the present invention will become more apparent by describing in detail exemplary embodiments thereof with reference to the attached drawings in which.

DETAILED DESCRIPTION OF EMBODIMENTS OF THE INVENTION

Figure 1:
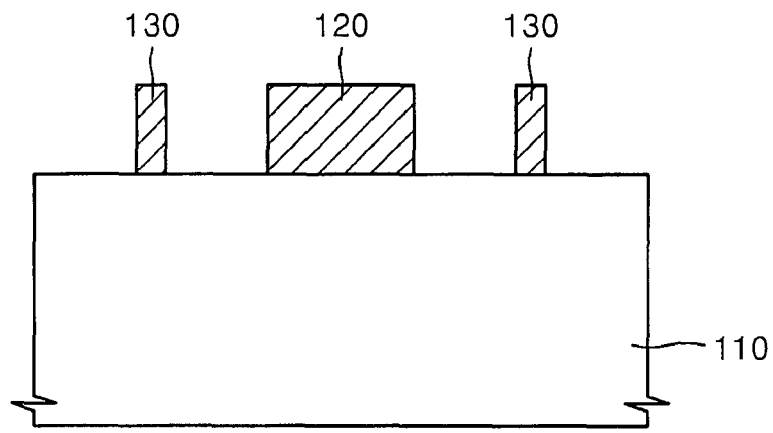
FIG. 1 is a sectional view illustrating a conventional photomask.

Embodiments of the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete. In the drawings, the thicknesses of layers and regions are exaggerated for clarity.

In embodiments of the present invention, a photomask can be used when performing an exposure in a photolithography process. In this case, the photomask may be termed to as a reticle, which, however, will not limit a scope of the present invention.

Figure 2:
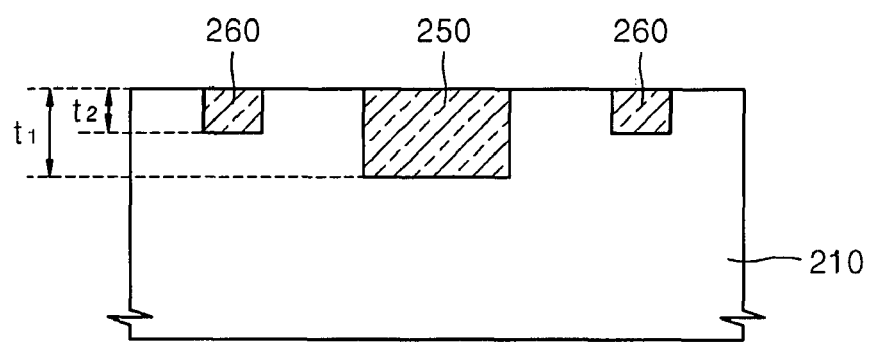
FIG. 2 is a sectional view illustrating a photomask according to an embodiment of the present invention.

FIG. 2 is a sectional view illustrating a photomask according to an embodiment of the present invention.

Referring to FIG. 2, a photomask includes a transparent substrate 210, a circuit pattern 250 and assist patterns 260. The circuit pattern 250 is transferred onto a semiconductor substrate during photolithography. However, the assist patterns 260 assist the transfer of the circuit pattern 250, but are minimally transferred onto the semiconductor substrate, or are not transferred at all. For example, if the circuit patterns 250 have an isolated form without having a regular form, the assist patterns 260 can increase the depth of focus and the critical dimensional margin. Accordingly, the assist patterns 260 can be distinguished from dummy patterns that are actually transferred onto the semiconductor substrate.

More specifically, the circuit pattern 250 may be recessed from a surface of the transparent substrate 210, and have a first thickness $t_1$. The circuit pattern 250 can be used for, e.g., a gate or a metal interconnect of a semiconductor device, but the scope of the present invention is not limited to such a usage. For example, the circuit pattern 250 can include a light-blocking layer or a phase-shifter. The light-blocking layer scarcely allows for transmission of light, but the phase-shifter allows for transmission of a certain amount of light. In certain embodiments, the light-blocking layer may include a chrome (Cr) layer or a tantalum (Ta) layer, and the phase-shifter may include a MoSiON layer.

The assist patterns 260 are recessed from the surface of the transparent substrate 210, and have a second thickness $t_2$. The assist patterns 260 may be disposed about the perimeter of the circuit pattern 250, e.g., in this figure, at both sides of the circuit pattern 250. Accordingly, the assist patterns 260 are adjacent to the circuit pattern 250, and no patterns are interposed between them. The assist patterns 260 may include a light-blocking pattern layer or a phase-shifter similar to the circuit pattern 250, for example.

The second thickness $t_2$ is smaller than the first thickness $t_1$, which is too small to be transferred onto the semiconductor substrate in a photolithography process. For example, the second thickness $t_2$ may have a range of 20~85% of the first thickness $t_1$. The second thickness $t_2$ may be adjusted in view of a wavelength of the light used when performing photolithography and transmissivity of the assist patterns 260. However, in the current embodiment, the transfer of the assist patterns 260 is not entirely adjusted solely by the second thickness $t_2$ of the assist pattern 130. The critical dimension of the assist patterns 260 is still smaller than that of the circuit pattern 250, so that the light transmission by the diffraction phenomenon of the light is yet effective, and thus the second thickness $t_2$ of the assist pattern 260 can be suitably controlled.

In the current embodiment, the assist patterns 260 may optionally have a critical dimension that is equal to, or greater than, the conventional one. This is because, as described with reference to FIG. 1, the critical dimension of the assist pattern 130 was conventionally minimized to block the transfer of the assist patterns 130 onto the semiconductor substrate. However, according to the current embodiment, the thickness of the assist patterns 260 is controlled as well as the critical dimension thereof in order to adjust the transmission of the light, so that the assist patterns are only partially affected by their critical dimension.

Consequently, the assist patterns 260 have a relatively large critical dimension and, moreover, are recessed into the transparent substrate 210. Accordingly, the assist patterns 260 have no concern of a collapse when cleansing, etc. Therefore, the assist patterns 260 in this configuration can have significantly high reliability.

Figure 3:
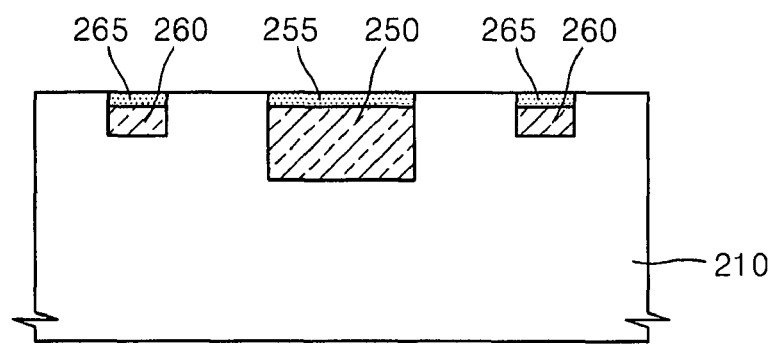
FIG. 3 is a sectional view illustrating a photomask according to another embodiment of the present invention.

FIG. 3 is a sectional view illustrating a photomask according to another embodiment of the present invention, which is a modified version of the photomask illustrated in FIG. 2. Thus, repeated description in both embodiments will not be provided.

Referring to FIG. 3, a photomask further includes anti-reflection layers 255 and 265 located on a circuit pattern 250 and assist patterns 260. The anti-reflection layers 255 and 265 prevent reflection of light from surfaces of the circuit pattern 250 and the assist patterns 260. Such anti-reflection layers 255 and 265 can heighten reliability of a defect test of the photomask. For example, the anti-reflection layers 255 and 265 may include an oxide film of a light-blocking layer. For example, the anti-reflection layers 255 and 265 may include a chrome oxide film or a tantalum oxide film.

Figure 4:
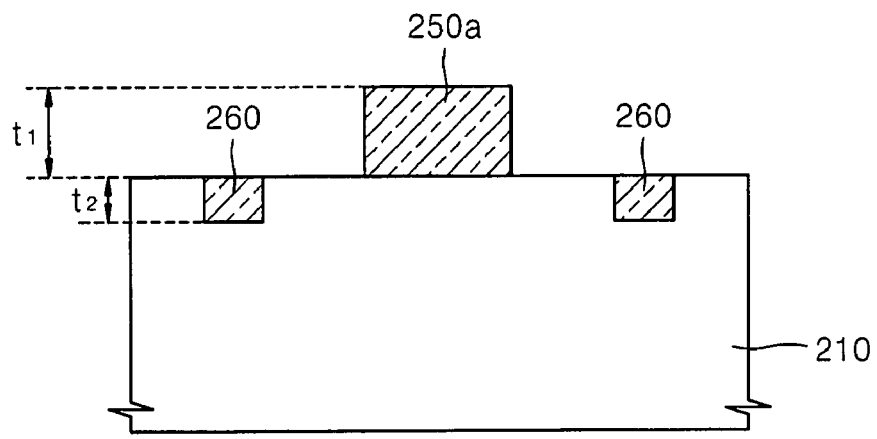
FIG. 4 is a sectional view illustrating a photomask according to another embodiment of the present invention.

FIG. 4 is a sectional view illustrating a photomask according to another embodiment of the present invention. The photomask of the current embodiment is dissimilar to the photomask described with reference to FIG. 2 in the arrangement of circuit patterns. Thus, repeated description of similar element configurations in both embodiments will not be provided.

Referring to FIG. 4, a circuit pattern 250a is provided on a transparent substrate 210. However, assist patterns 260 are identical to those described with reference to FIG. 2. Because of having a sufficiently large critical dimension, the circuit pattern 250a is relatively free from the inferior formation or the collapse. However, since the assist patterns 260 of the photomask are also recessed into the transparent substrate 210, the current embodiment yet has the advantages of the above embodiment described with reference to FIG. 2.

Furthermore, the photomask may include anti-reflection layers (255 and 265 of FIG. 3) on the circuit pattern 250a and the assist patterns 260, for example, in a manner similar to the photomask of FIG. 3.

FIGS. 5 through 11 are sectional views illustrating a method of fabricating a photomask according to an embodiment of the present invention.

Figure 5:
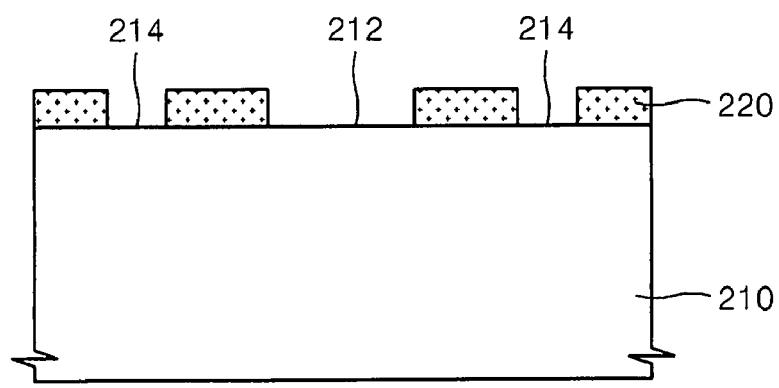
FIGS. 5 through 11 are sectional views illustrating a method of fabricating a photomask according to an embodiment of the present invention.

Referring to FIG. 5, first protection film patterns 220 are formed on a transparent substrate 210. The first protection-film patterns 220 expose a circuit pattern region 212 and assist pattern regions 214 on the transparent substrate 210. For example, an appropriate material layer of, e.g., a chrome layer, is formed on the transparent substrate 210 and patterned using electron beam recording, thereby forming the first protection film patterns 220. Electron beam recording can be easily carried out by reversing a polarity of patterns of the desired photomask.

Figure 6:
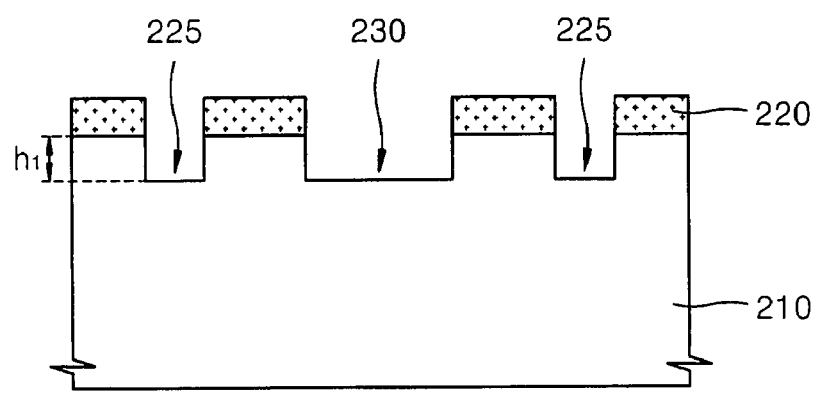

Referring to FIG. 6, the transparent substrate 210 is etched using the first protection film patterns 220 as an etch barrier film to form a pair of first trenches 225 and a preliminary second trench 230. The pair of the first trenches 225 may be formed in the assist pattern regions 214, and the preliminary second trench 230 may be formed in the circuit pattern region 212. The preliminary second trench 230 may be disposed on a portion of the transparent substrate 210 between the pair of first trenches 225. The first trenches 225 and the preliminary second trench 230 may have a first depth $h_2$ from a surface of the transparent substrate 210.

Figure 7:
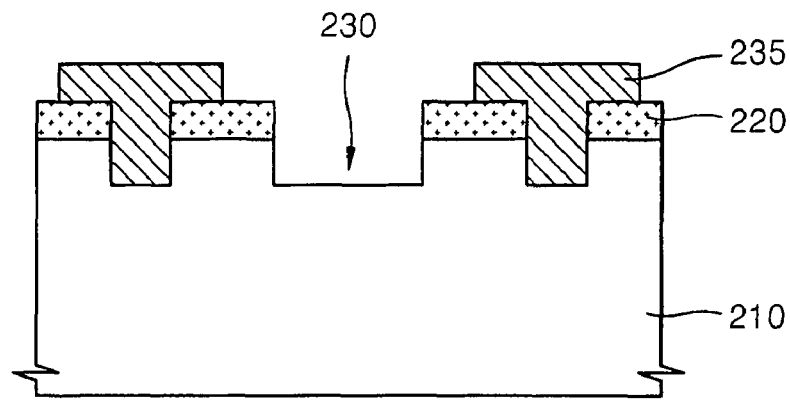

Referring to FIG. 7, second protection film patterns 235 covering the first trenches 225 are formed. The second protection film patterns 235 can be further extended onto the first protection film patterns 220, but expose the preliminary second trench 230. For example, an appropriate material layer, e.g., a chrome layer or a photoresist layer, is formed and patterned using electron beam recording, thereby forming the second protection film patterns 235.

Figure 8:
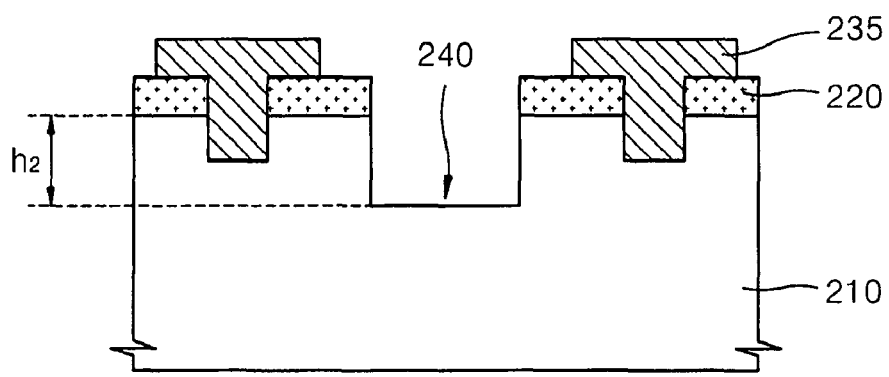

Referring to FIG. 8, the transparent substrate 210 is further etched using the first protection film patterns 220 and the second protection film pattern 235 as an etch barrier film, to form a second trench 240. The second trench 240 may have a second depth $h_2$ deeper than the first depth $h_1$ by further etching the preliminary second trench 230. For example, the first depth $h_1$ may have a range of 20~85% of the second depth $h_2$.

Figure 10:
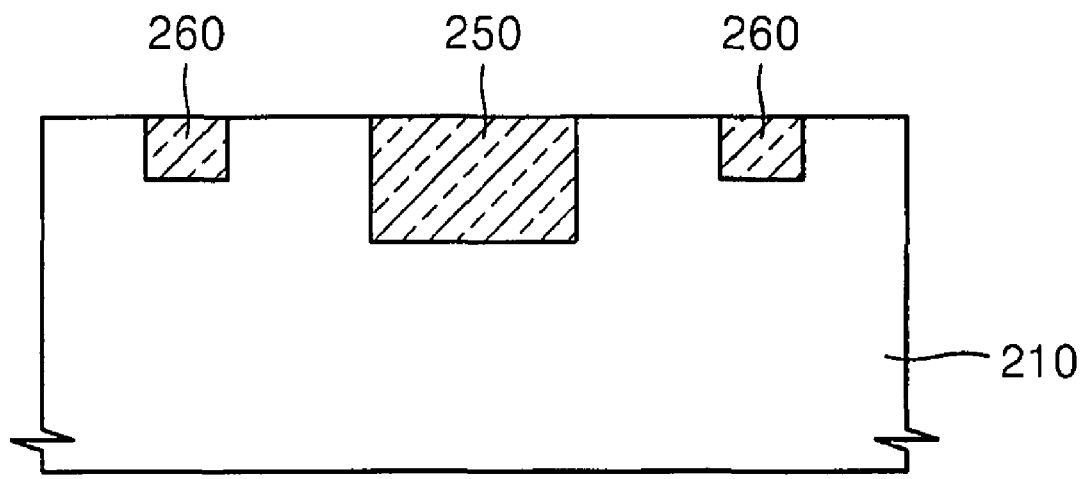

The first depth $h_1$ controls a thickness of the assist patterns (260 of FIG. 10), and the second depth $h_2$ controls a thickness of the circuit pattern (250 of FIG. 10). Therefore, the first depth $h_1$ corresponds to the second thickness $t_2$ of the assist patterns 260 of FIG. 2, and the second depth $h_2$ corresponds to the first thickness $t_1$ of the circuit pattern 250 of FIG. 2, respectively.

Figure 9:
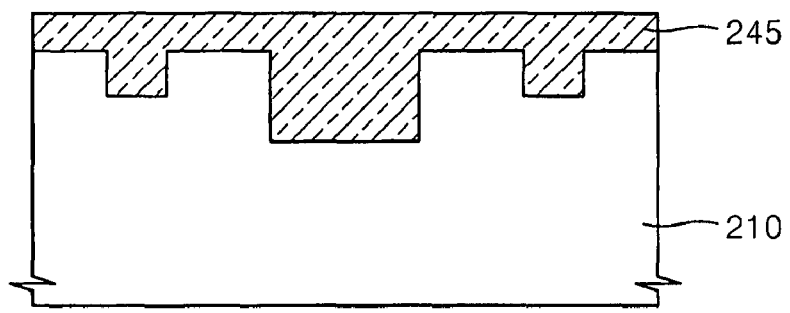

Referring to FIG. 9, a light-blocking layer filled in the first trenches 225 and the second trench 240 is formed. For example, the light-blocking layer may be formed using typical material deposition such as chemical vapour deposition (CVD).

Referring to FIG. 10, the light-blocking layer is planarized to expose the transparent substrate 210 to simultaneously form a circuit pattern 250 filled in the second trench 240 and the assist patterns 260 filled in the first trenches 225. For example, planarization may be performed by etch back or chemical mechanical polishing (CMP). The forming and planarizing of the light-blocking layer may be referred to as a damascene method. Accordingly, regardless of different thicknesses, the circuit pattern 250 and the assist patterns 260 can be simultaneously formed, which is thus economical.

Figure 11:
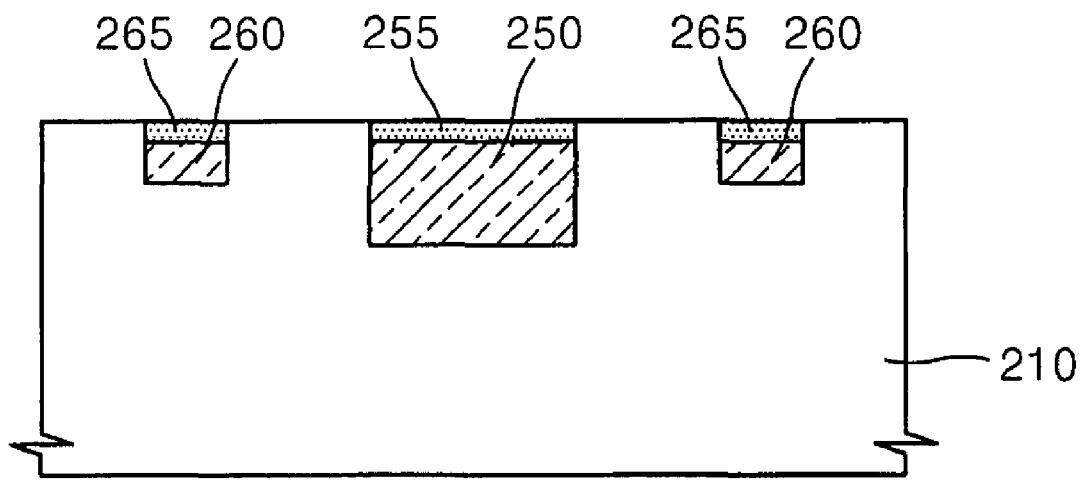

Referring to FIG. 11, surfaces of the circuit pattern 250 and the assist patterns 260 are oxidized to form anti-reflection layers 255 and 265. For example, the anti-reflection layers 255 and 265 may be formed using thermal oxidation. In another embodiment of the present invention, the light-blocking layer described with reference to FIGS. 9 and 10 may be replaced with a phase shifter.

Additionally, in another embodiment of the present invention, the anti-reflection layers 255 and 265 may be omitted.

Moreover, in another embodiment of the present invention, the first trenches 225 and the second trench 240 illustrated in FIGS. 5 through 8 may be sequentially formed using individual protection film patterns (not shown) different from each other.

The method of fabricating the photomask according to the above embodiment may be used for the method of fabricating the photomask described with reference to FIGS. 2 and 3. However, in the method of fabricating the photomask according to the above embodiment, the photomask illustrated in FIG. 4 may be formed by changing the formation of the circuit pattern 250 but forming the assist patterns 260 in the manner described above in FIGS. 5-11. For example, the circuit pattern 250a of FIG. 4 can be easily formed by forming and patterning the light-blocking layer formed on the transparent substrate 210 at FIG. 9.

In a photomask according to the present invention, assist patterns can have a critical dimension greater than that of conventional assist patterns, and can be recessed within a transparent substrate. Therefore, because there is no concern of the collapse of the assist patterns during cleansing, etc., the photomask has a significantly high reliability.

According to a method of fabricating the photomask of the present invention, the circuit pattern and the assist patterns having thicknesses that are different from each other can be simultaneously formed, which is thus economical.

While embodiments of the present invention has been particularly shown and described with reference to exemplary embodiments thereof, it will be understood by those of ordinary skill in the art that various changes in form and detail may be made herein without departing from the spirit and scope of the present invention as defined by the following claims.

What is claimed is:

1. A photomask comprising:
   a transparent substrate having a first trench and second trenches recessed into the transparent substrate relative to a surface thereof, the first trench having a first depth and the second trenches having second depths;
   a circuit pattern filled in the first trench and having a first thickness; and
   assist patterns configured to increase a depth of focus and a critical dimensional margin of the circuit pattern, the assist patterns being filled in the second trenches and each having a second thickness less than the first thickness.

2. The photomask of claim 1, wherein each of the circuit pattern and the assist patterns comprises a light-blocking layer.

3. The photomask of claim 2, wherein each of the circuit pattern and the assist patterns further comprises an anti-reflection layer on the light-blocking layer.

4. The photomask of claim 3, wherein the anti-reflection layer comprises an oxide film of the light-blocking layer.

5. The photomask of claim 2, wherein each of the circuit pattern and the assist patterns comprises a phase-shifter.

6. The photomask of claim 1, wherein the second thickness is of a thickness that is about 20~85% of the first thickness.

7. A photomask comprising:
a transparent substrate having trenches recessed into the transparent substrate relative to a surface thereof;
a circuit pattern on the surface of the transparent substrate, the circuit pattern having a first height; and
assist patterns configured to increase a depth of focus and a critical dimensional margin of the circuit pattern, the assist patterns being filled in the trenches, wherein each assist pattern has a thickness that is less than the first height of the circuit pattern.

8. The photomask of claim 7, wherein each of the circuit pattern and the assist patterns comprises a light-blocking layer.

9. The photomask of claim 8, wherein each of the circuit pattern and the assist patterns further comprises an anti-reflection layer on the light-blocking layer.

10. The photomask of claim 7, wherein each of the circuit pattern and the assist patterns comprises a phase-shifter.

11. The photomask of claim 7, wherein the thickness is is about 20~85% of the first height.

12. A method of fabricating a photomask comprising:
forming a pair of first trenches in a transparent substrate, the pair of first trenches having a first depth relative to a surface of the transparent substrate;
forming a second trench in a portion of the transparent substrate between the pair of first trenches, the second trench having a second depth that is greater than the first depth; and
simultaneously forming a circuit pattern filled in the second trench and assist patterns filled in the first trenches, using a damascene method,
wherein a thickness of the circuit pattern is greater than a thickness of each of the assist patterns.

13. The method of claim 12, wherein the forming of the first trenches comprises:
forming a first protection film pattern on the transparent substrate; and
etching the transparent substrate to the first depth using the first protection film pattern as an etch barrier film.

14. The method of claim 13, wherein the forming of the second trench comprises:
forming the pair of first trenches, and simultaneously etching a portion of the transparent substrate between the pair of first trenches as deep as the first depth;
forming second protection film patterns covering the pair of first trenches; and
further etching the transparent substrate already etched to the first depth down to the second depth, using the first protection film pattern and the second protection film patterns as an etch barrier film.

15. The method of claim 13, wherein the forming of the first protection film pattern and the second protection film patterns is performed using electron beam recording.

16. The method of claim 12, wherein the forming of the circuit pattern and the assist patterns comprises forming light-blocking layers filled in the first trenches and the second trench.

17. The method of claim 16, further comprising forming anti-reflection layers by oxidizing surfaces of the light-blocking layers of the circuit pattern and the assist patterns.

18. The method of claim 12, wherein the forming of the circuit pattern and the assist patterns comprises forming a phase-shifter filled in the first trenches and the second trench.

19. The method of claim 12, wherein the first depth is of a depth about 20~85% of the second depth.

20. A method of fabricating a photomask comprising:
forming a pair of first trenches in a transparent substrate, the pair of first trenches being spaced apart from each other and having a first depth relative to a surface of the transparent substrate;
forming a light-blocking layer on the transparent substrate including the first trenches, that fills the first trenches; and
patterning the light-blocking layer to provide assist patterns in the first trenches and a circuit pattern in a region between the assist patterns, the circuit pattern having a height that is greater than a thickness of each of the assist patterns,
wherein the circuit pattern is spaced apart from the assist patterns.

21. The method of claim 20, wherein the forming of the first trenches comprises:
forming a first protection film pattern on the transparent substrate; and
etching the transparent substrate to the first depth using the first protection film pattern as an etch barrier film.

22. The method of claim 20, further comprising forming anti-reflection layers by oxidizing surfaces of the light-blocking layers of the circuit pattern and the assist patterns.

23. The method of claim 20, wherein the forming of the circuit pattern and the assist patterns comprises forming a phase-shifter.

24. The method of claim 20, wherein the thickness of each of the assist patterns is about 20~85% of the height of the circuit pattern.

25. The photomask of claim 1, wherein the assist patterns are not transferred onto a semiconductor substrate during photolithography.

26. The photomask of claim 7, wherein the assist patterns are not transferred onto a semiconductor substrate during photolithography.

* * * * *